United States Patent [19]

Mett et al.

[11] Patent Number: 5,737,177
[45] Date of Patent: Apr. 7, 1998

[54] APPARATUS AND METHOD FOR ACTIVELY CONTROLLING THE DC POTENTIAL OF A CATHODE PEDESTAL

[75] Inventors: Richard Raymond Mett, Santa Clara; Mahmoud Dahimene, Sunnyvale; Paul E. Luscher, Sunnyvale; Siamak Salimian, Sunnyvale; Mark Steven Contreras, Sunnyvale, all of Calif.

[73] Assignee: Applied Materials, Inc., Santa Clara, Calif.

[21] Appl. No.: 730,885

[22] Filed: Oct. 17, 1996

[51] Int. Cl.$^6$ ........................... H02N 13/00
[52] U.S. Cl. ........................... 361/234; 279/128
[58] Field of Search ............ 279/128; 361/230, 361/233, 234, 235

[56] References Cited

U.S. PATENT DOCUMENTS 4,399,016 8/1983 Tsukada et al. ............... 204/192 R
4,968,374 11/1990 Tsukada et al. ............... 156/345
5,467,249 11/1995 Barnes et al. ............... 361/234

Primary Examiner—Jeffrey A. Gaffin
Assistant Examiner—Thuy-Trang Huynh
Attorney, Agent, or Firm—Thomason & Moser

[57] ABSTRACT

A method and apparatus for actively controlling the DC cathode potential of a wafer support pedestal within a semiconductor wafer processing system. The apparatus contains a variable DC power supply coupled through an RF filter to a cathode pedestal. The variable DC power supply is actively controlled by a control signal generated by a cathode bias control unit, e.g., a computer or other control circuitry. The cathode bias control unit can be as simple as an operator adjustable control signal, e.g., a rheostat. However, for more accurate control of the DC power supply, a feedback circuit is used that generates a control signal that is proportional to the peak-to-peak voltage on a cathode pedestal. The application of the DC bias to the pedestal reduces the DC potential difference between the wafer and the cathode and, thereby avoids arcing from the wafer to the pedestal.

13 Claims, 3 Drawing Sheets

APPARATUS AND METHOD FOR ACTIVELY CONTROLLING THE DC POTENTIAL OF A CATHODE PEDESTAL

BACKGROUND OF THE DISCLOSURE

1. Field of the Invention

The invention relates to semiconductor wafer processing equipment, and more particularly, to apparatus and a concomitant method of actively controlling the potential of a cathode pedestal used to support a workpiece in a semiconductor wafer processing system.

2. Description of the Background Art

Electrostatic chucks are used for holding a workpiece in various applications ranging from holding a sheet of paper in a computer graphics plotter to holding a semiconductor wafer within a semiconductor fabrication process chamber. Although electrostatic chucks vary in design, they all are based on the principle of applying a voltage to one or more electrodes in the chuck so as to produce opposite polarity charges in the workpiece and electrodes respectively. The electrostatic attractive force between the oppositely polarized charges pulls the workpiece against the chuck, thereby retaining the workpiece.

In semiconductor wafer processing equipment, electrostatic chucks are used for clamping wafers to a support pedestal during processing. The support pedestal may form both an electrode and a heat sink as used in etching or chemical vapor deposition (CVD) applications. However, more typically, the chuck electrode is separate from the pedestal. More particularly, the electrostatic chuck has a layer of dielectric material covering a conductive pedestal base. Atop the dielectric layer is an electrode, or electrodes and atop the electrode is a second dielectric layer. The upper surface of the second dielectric layer forms a wafer support surface. In a "unipolar" electrostatic chuck, voltage is applied to a single electrode relative to some internal chamber ground reference. Electrostatic force is established between the wafer being clamped and the electrostatic chuck. To facilitate plasma generation, RF power is coupled to the conductive pedestal (cathode) that supports the electrostatic chuck. The anode is a grounded electrode that is located in the reaction chamber (e.g., the chamber walls). By applying RF power to the anode and cathode while a process gas such as carbon tetrafluoride ($CF_4$) in the chamber, a plasma is formed. The plasma generated proximate the wafer references the wafer back to ground although some voltage drop occurs across the plasma sheaths that form at both the wafer being clamped and the reference electrode. In electrostatic chuck applications where the plasma forms the conductive reference path, the wafer is self-biased by the plasma and the chuck electrode is biased by a DC power supply. Consequently, the potential difference between the electrode and self-biased wafer cause oppositely polarized charges to accumulate on the wafer backside. As such, the wafer is retained upon the chuck surface by a Coulomb force. At times, the difference in voltage between the cathode pedestal and the wafer can become large enough to induce a discharge or arc from the wafer to the cathode pedestal. Consequently, contaminants, e.g., aluminum particles from the pedestal, are released into the process chamber and the pedestal and/or wafer may be damaged.

One solution to avoiding such a discharge is to position electrodes about the periphery of the wafer that are in contact with the plasma and are electrically connected to the pedestal. Such electrodes are usually in the form of silicon carbide pins that are distributed about the periphery of the wafer. Using such pins, the plasma voltage is connected to the pedestal thus biasing the cathode pedestal to the plasma potential. As such, the voltage difference between the wafer and the pedestal is substantially diminished and arcing may be avoided. However, use of such silicon carbide pins produces contaminants within the process chamber, i.e., the pins are consumed by the plasma. Also, such consumption requires the pins to be replaced often. In addition, the pins cause plasma non-uniformity and a five percent decrease in etch rate.

Therefore, a need exists in the art for an apparatus and concomitant method of actively controlling a DC bias voltage on the cathode pedestal to minimize the potential difference between the wafer and the cathode pedestal.

SUMMARY OF THE INVENTION

The disadvantages associated with the prior art are overcome by the present invention. The present invention is a variable DC power supply coupled through an RF filter to a cathode pedestal of a plasma enhanced semiconductor wafer processing system. The variable DC power supply is actively controlled by a control signal generated by a cathode bias control unit. The cathode bias control unit can be as simple as an operator adjustable voltage control, e.g., a rheostat. However, for more accurate control of the DC power supply, a feedback circuit is used that generates a control signal that is proportional to an indicia of the magnitude of the self-bias voltage on the wafer. One such indicia is the peak-to-peak voltage on the cathode pedestal.

In the preferred embodiment of the invention, the invention monitors the peak-to-peak voltage $V_{pp}$ on the pedestal, produces a control signal in response to the magnitude of the peak-to-peak voltage on the pedestal, adjusts the variable DC power supply to apply a DC voltage to the pedestal that biases the RF power to a DC level that avoids arcing from the wafer to the cathode pedestal. This process can be accomplished manually, but is more efficiently implemented using a feedback circuit or a programmed computer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
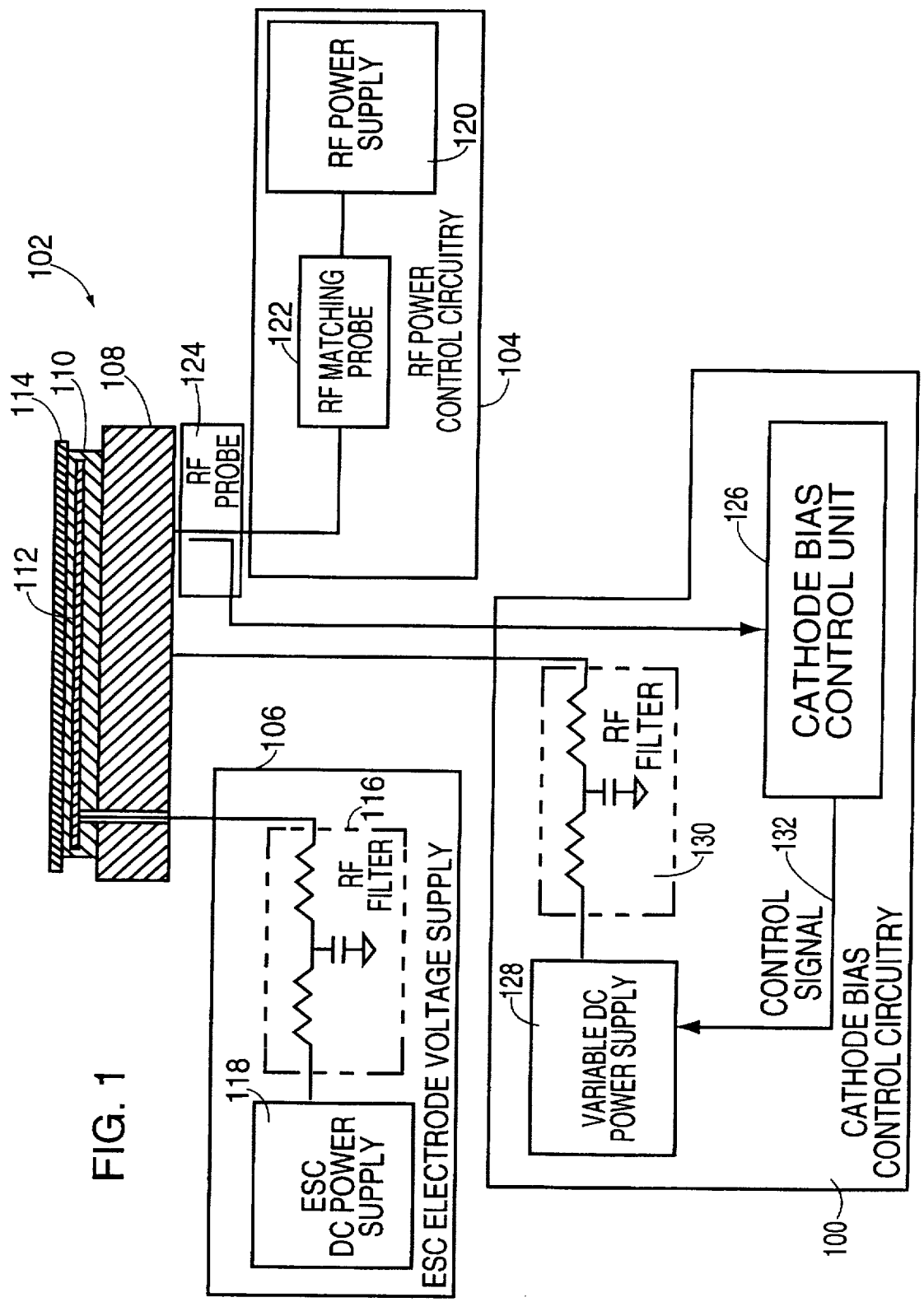
FIG. 1 depicts a simplified block diagram of the present invention.

FIG. 1 depicts a block diagram of the present invention as used in conjunction with conventional electrostatic chuck equipment as used in a semiconductor wafer processing system. More specifically, the present invention is an active bias control circuit 100 that is coupled to a cathode pedestal 108 which operates in conjunction with conventional RF power control circuitry 104. To retain a workpiece (a semiconductor wafer 114) upon the pedestal, an electrostatic chuck (ESC) 102 is affixed atop the cathode pedestal 108. The electrostatic chuck conventionally comprises a dielectric layer deposited, or affixed by adhesive, to the cathode pedestal 108. The chuck further contains, imbedded within the dielectric layer, one or more electrodes 112. In FIG. 1, a semiconductor wafer 114 is shown resting atop the surface of dielectric layer 110. The electrode 112 of the electrostatic chuck is coupled to an ESC electrode power supply 106. The ESC supply 106 contains a DC power supply 118 coupled to an RF filter 116. In use, once a plasma is formed in the chamber above the wafer, the plasma self biases the wafer to a nominal DC value. Thereafter, the DC power supply 118 applies a voltage through RF filter 116 to electrode 112. A difference in potential between the electrode voltage and the self-bias voltage on the wafer causes oppositely charged particles to accumulate on the under side of the wafer and on the surface of the dielectric such that these accumulating charges form an attractive force between the wafer and the electrostatic chuck. As a result, the wafer is electrostatically retained on the chuck surface.

To form the plasma within the reaction chamber an RF signal must be applied to the chamber volume. Such RF power is applied via the conductive cathode pedestal and the RF power control circuitry 104. The RF power control circuitry 104 contains an RF power supply 120 that is coupled to the cathode pedestal through an RF matching network 122.

The active bias control circuitry 100 comprises a cathode bias control unit 126, a variable DC power supply 128 (a high voltage DC-to-DC converter), and an RF filter 130. The DC voltage from the variable DC voltage power supply 132 is coupled to the cathode pedestal via the RF filter 130. The magnitude of the variable DC voltage generated by the variable DC power supply 128 is controlled by a control signal on path 132. This control signal is generated by the cathode bias control unit 126 in response to a certain input signal. The input signals may be as simple as a rheostat connected to a voltage source such that a user can adjust the DC bias voltage applied to the cathode pedestal to avoid arcing. However, typically the control input signal is a signal that indicates the magnitude of the voltage difference between the cathode pedestal and the wafer. One such indicia is the peak-to-peak voltage on the cathode pedestal. Such a signal can be generated by an RF probe 124 (e.g., a capacitive probe). Using the signal produced by the RF probe, the bias control unit 126 generates the control signal that causes the variable DC power supply to apply a negative voltage that compensates for the positive voltage that is accumulated on the wafer as wafer processing proceeds.

Figure 2:
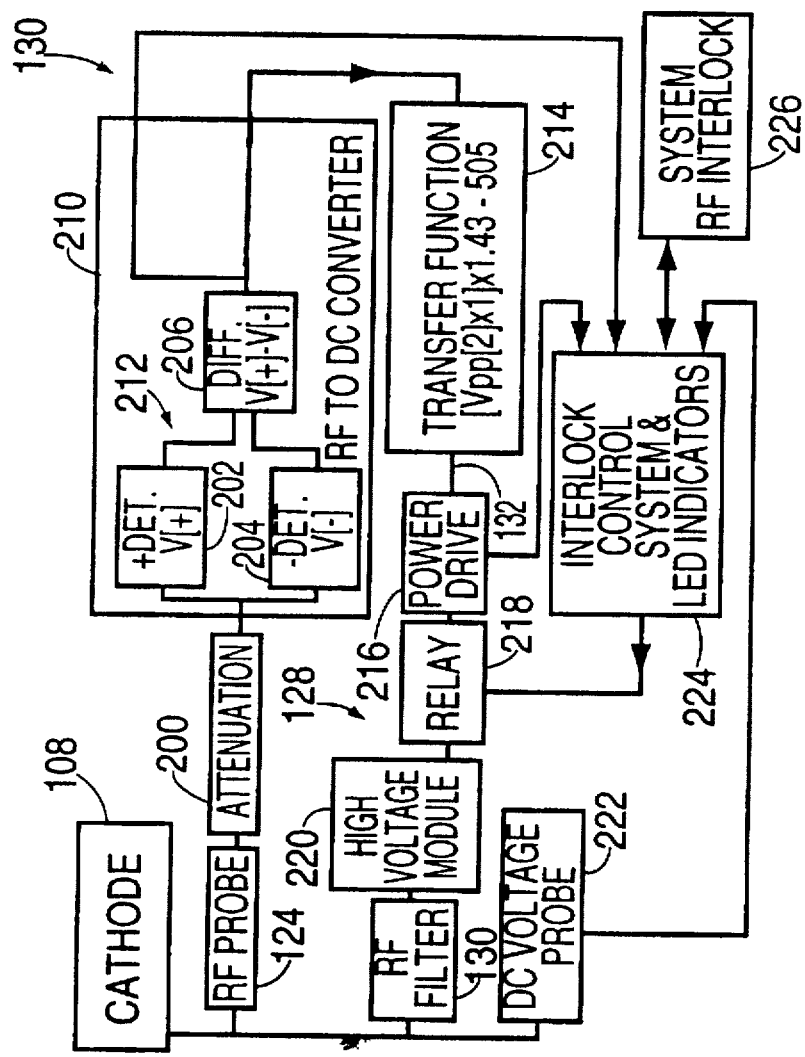
FIG. 2 depicts a detailed block diagram of the DC bias control circuit of FIG. 1.

FIG. 2 depicts a detailed block diagram of the cathode bias control circuitry 100 of FIG. 1. The cathode bias control circuitry 100 contains an RF probe 124, an attenuator 200, RF to DC converter 210 and a transfer function generator 214. Further components include a power drive unit 216, a relay 218, a high voltage module 220, an RF filter 130, a DC voltage probe 222, an interlock control system 224 and a system RF interlock 226.

The attenuator 200 functions to reduce the magnitude of the RF signal coupled from the probe 124 to a signal level that can be handled by the RF-to-DC converter 210. The RF probe 124 is a capacitive probe that reduces the signal strength approximately by a factor of 200 to 1. The attenuator coupled to the probe is a 2.5 to one attenuator arranged as a resistive divider network. The attenuator supplies a signal to the RF-to-DC converter 210 that represents the RF signal at a 1 volt per kilovolt level.

The RF-to-DC converter 210 contains a peak-to-peak voltage detector 212 and a calibration amplifier 208. The peak-to-peak voltage detector 212 generates a DC value that is representing the peak-to-peak voltage of the RF signal at the output of the attenuator. The peak-to-peak voltage detector 212 contains a positive peak detector 202, a negative peak detector 204 and a differential amplifier 206. The positive peak detector 202 provides a DC voltage indicative of the positive magnitude of the RF signal. Similarly, the negative peak detector provides a negative DC voltage indicative of the negative magnitude of the RF signal. One simple technique for providing peak detection is to pass the RF signal through a diode which selects either the positive or negative voltage to be detected (e.g., rectifies the signal) and then couples the output of the diode signal to a capacitor. The capacitor would charge to a maximum value equivalent to the value detected by the diode. A relatively high resistance value bleeder resistor is typically coupled across the capacitor to bleed off the charge over a certain period of time. As such, the peaked detector would track the magnitude of the RF signal.

The output of the positive peak detector 202 is coupled to the positive input terminal of the differential amplifier 206. Similarly, the negative peak detector 204 is coupled to the negative input terminal of the differential amplifier 206. The output of the differential amplifier represents the positive peak detector voltage minus the negative peak detector voltage. As such, this DC value represents the peak-to-peak voltage as detected by the RF probe. Typically, the peak-to-peak voltage is approximately four volts for a two kilovolt RF power level coupled to the cathode.

The output of the differential amplifier 200 is coupled to the transfer function generator 214. The generator 214 processes the peak-to-peak voltage value to produce the DC supply control signal 136 that is ultimately used to control the output of the high voltage module 220. The control signal on path 136 generally varies from 0 to 12 volts to control the DC-to-DC converter's output from 0 to 3 kilovolts.

The transfer function generator 210 could merely track the magnitude of the peak-to-peak voltage and generate a control signal that is simply a scaled version of the peak-to-peak voltage. However, empirical data has shown that, due to scaling of DC bias on the wafer as a function of RF peak-to-peak voltage which depends on chamber geometry, a system that simply processes the peak-to-peak voltage or the detected voltage directly into a DC value is inaccurate in tracking the DC bias that is accumulated on the wafer.

Consequently, the transfer function generator 210 produces a well-controlled, DC control signal in response to the peak-to-peak voltage. The particular transfer function used has been derived from empirical data by comparing the peak-to-peak voltage of the RF signal coupled to the cathode with the DC bias voltage to which the wafer charges during processing. The relationship between these values has been found to be substantially linear for typical processes performed in the MxP+ oxide etch chamber manufactured by Applied Materials, Inc. of Santa Clara, Calif. This linear relationship has been used to develop a linear equation that produces the control signal in response to the peak-to-peak voltage. The transfer function used to develop the control signal is: $-(V_{pp}/2) \times 1.43 - 505$, where $V_{pp}$ is the peak-to-peak voltage at the output of the calibration amplifier 208. This equation can be implemented by a linear circuit using an operational amplifier. This transfer function depends upon chamber geometry and would vary in form when applied to chambers other than the system referred to above. Although the relationship of a peak-to-peak voltage versus the wafer bias voltage is typically linear, the magnitude of the slope may vary with plasma temperature and plasma density as well as the chemistry of the gases used to generate the plasma. Furthermore, some gases which are electronegative in nature may require a non-linear DC bias control signal.

The control signal is coupled to a power drive unit 216 that controls the high voltage module 220 (a DC-to-DC converter). The power drive unit 216 converts the output from the transfer function generator into a high power control signal that is used by the high voltage module. The high voltage is coupled through an RF filter 130 to the cathode 108.

A relay 218 is positioned between the power drive unit and the high voltage module. The relay forms a safety device that can selectively deactivate the high voltage in response to a control signal generated by the interlock control system 224. The interlock control system controls activation and deactivation of the relay 218.

The DC voltage probe 222 is coupled to the cathode 108 to monitor the magnitude of DC bias voltage applied to the cathode. The probe 222 is coupled to the interlock control system 224. The interlock control system is also coupled to the RF-to-DC converter 210, the power drive unit 216, and a system RF interlock 226. The interlock control system 224 monitors these components to determine the operational state of the bias control circuit. For example, the system RF interlock 226 determines when certain safety interlocks are active. Such interlocks include the chamber being open such that the cathode is exposed to personnel. As such, the interlock control system switches the relay into an open position to deactivate the high voltage. Additionally, by monitoring the $V_{pp}$ and power drive unit the system 224 identifies when RF power is applied to the cathode. The system then checks the DC voltage probe measurement to ensure that its magnitude is within a predefined window, e.g., an upper and lower voltage threshold. If it is not within the window, arcing may occur. Therefore, an indicator lamp (LED) is illuminated to indicate a potential for arcing and the relay is switched to an open position deactivating the high voltage.

Although the foregoing embodiment of the invention was described as a hardware implementation, those skilled in the art will understand that the invention could be implemented, in part or entirely, as a software routine executed on a computer.

Figure 3:
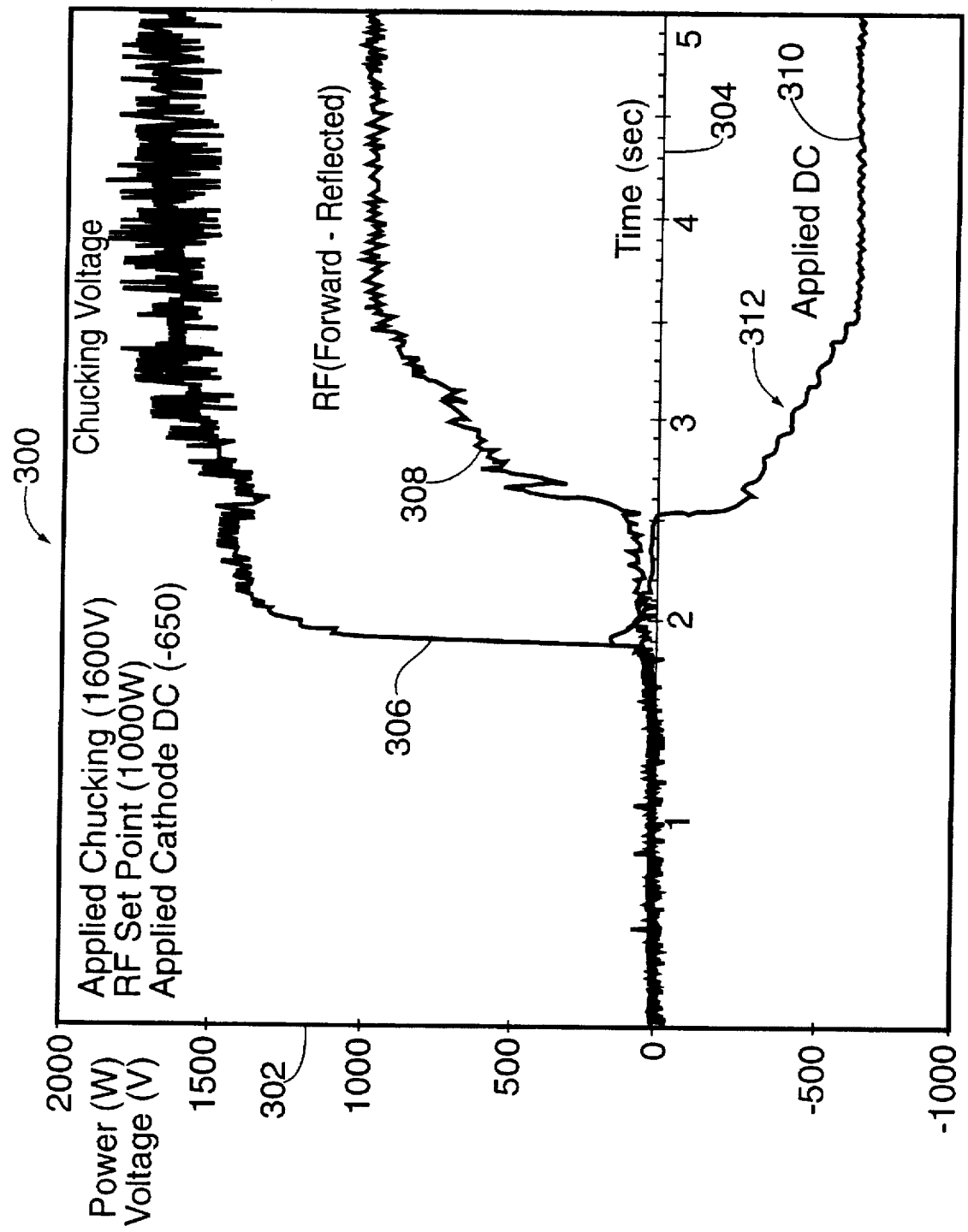
FIG. 3 depicts a graph representing chucking voltage applied to an electrostatic chuck, the magnitude of RF power coupled to a cathode pedestal and the magnitude of an applied DC signal.

FIG. 3 depicts the voltages that are applied to the electrostatic chuck 102 and cathode pedestal 108 in FIG. 1. The graph 300 of FIG. 3 contains a vertical axis 302 representing voltage applied to the electrostatic chuck and the applied power to the pedestal. The graph also contains a horizontal axis 304 representing time in seconds. The nominal applied chucking voltage is approximately 1600 volts, as shown as curve 306. After the chucking voltage is applied, the RF forward power minus reflected power begins to rise a short time after application of the chucking voltage. In response to the rise in the RF power, the variable DC power supply begins applying a negative voltage to the cathode pedestal to compensate for any DC voltage accumulated on the wafer. The DC bias voltage is shown as curve 310. This curve rises along a well defined path (region 312) as controlled by the transfer function. The result is a net decrease in the difference potential between the wafer and the pedestal such that arcing is avoided. Furthermore, use of the invention discontinues the use of consumable silicon carbide pins that protrude into the plasma. As such, the invention eliminates contaminants resulting from consumption of the pins and improves plasma uniformity which results in increased etch rate and reduced potential for oxide gate damage.

Although various embodiments which incorporate the teachings of the present invention have been shown and described in detail herein, those skilled in the art can readily devise many other varied embodiments that still incorporate these teachings.

What is claimed is:

1. Apparatus for controlling a DC potential on a cathode pedestal used to support a workpiece, comprising:

a variable DC power supply coupled to said cathode pedestal;

a cathode bias control unit, coupled to said variable DC power supply, for generating a control signal that causes said DC power supply to produce a particular DC voltage, said control signal being generated in response to indicia of arcing potential between said workpiece and said cathode pedestal.

2. The apparatus of claim 1 wherein said indicia of arcing potential is a peak-to-peak voltage on said cathode pedestal.

3. The apparatus of claim 2 wherein said cathode bias unit comprises:

a peak-to-peak voltage detector for producing a peak-to-peak value of said AC voltage signal; and a transfer function generator, coupled to said peak-to-peak detector, for producing said control signal in response to said peak-to-peak value.

4. The apparatus of claim 3 further comprising an RF probe, coupled to said cathode pedestal, for generating said AC voltage signal.

5. The apparatus of claim 3 wherein said transfer function generator produces the control signal as $1.43 \, (V_{pp}/2) - 505$, where $V_{pp}$ is the peak-to-peak value.

6. The apparatus of claim 3 wherein said peak-to-peak detector further comprises:

a positive peak detector producing a positive peak voltage;

a negative peak detector producing a negative peak voltage; and a differential amplifier, coupled to said positive peak detector and said negative peak detector, for producing said peak-to-peak value.

7. Apparatus for controlling a DC potential on a cathode pedestal used to support a workpiece, comprising:

a variable DC power supply, coupled to said cathode pedestal, for applying a DC voltage to the cathode pedestal in response to a control voltage;

an RF probe, coupled to said cathode pedestal, for generating an AC voltage signal;

a positive peak detector, coupled to said RF probe, for producing a positive peak voltage;

a negative peak detector, coupled to said RF probe, for producing a negative peak voltage;

a differential amplifier, coupled to said positive peak detector and said negative peak detector, for producing a peak-to-peak value of said AC voltage signal; and a transfer function generator, coupled to said differential amplifier, for producing said control signal in response to said peak-to-peak value.

8. The apparatus of claim 6 wherein said transfer function generator produces the control signal as $1.43 \, (V_{pp}/2) - 505$, where $V_{pp}$ is the peak-to-peak value.

9. A method of controlling a DC potential on a cathode pedestal used to support a workpiece, comprising the steps of:

detecting an indicia of arcing between the workpiece and pedestal;

generating, in response to said indicia of arcing, a DC voltage having a magnitude that reduces the probability of arcing; and applying said DC voltage to said cathode pedestal.

10. The method of claim 9 wherein said indicia of arcing is a peak-to-peak voltage on said cathode pedestal.

11. The method of claim 9 wherein said generating step further comprises:

processing said peak-to-peak voltage using a transfer function to produce a control voltage; and controlling, in response to said control voltage, the magnitude of said DC voltage.

12. The method of claim 9 wherein said DC voltage magnitude is proportional to the peak-to-peak voltage on said cathode pedestal.

13. The method of claim 11 wherein said transfer function produces the control signal as $1.43\ (V_{pp}/2)-505$, where $V_{pp}$ is the peak-to-peak value.

* * * * *